United States Patent
Xia et al.

(10) Patent No.: US 7,365,975 B2
(45) Date of Patent: Apr. 29, 2008

(54) HEAT DISSIPATION DEVICE HAVING A FAN HOLDER FOR ATTACHMENT OF A FAN

(75) Inventors: Wan-Lin Xia, Shenzhen (CN); Tao Li, Shenzhen (CN); Ji-Yun Qin, Shenzhen (CN); Jun Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 50 days.

(21) Appl. No.: 11/308,772

(22) Filed: May 2, 2006

(65) Prior Publication Data

US 2007/0258210 A1    Nov. 8, 2007

(51) Int. Cl.
*H05K 7/20* (2006.01)

(52) U.S. Cl. .................. 361/695; 361/696; 361/697; 165/80.3; 165/104.33; 415/177; 415/213.1

(58) Field of Classification Search ............ 361/687, 361/692–697, 700, 698–702, 703, 709–710, 361/714–719; 165/80.3, 80.6, 80.5, 104.33, 165/121–126, 185; 174/15.1, 16.3; 257/722–727; 415/177, 178, 213.1, 214.1; 24/453, 451, 24/458; 248/505, 510

See application file for complete search history.

(56) References Cited

U.S. PATENT DOCUMENTS

| 6,304,445 | B1 | 10/2001 | Bollesen |
| 6,654,246 | B2* | 11/2003 | Wu ............................ 361/697 |
| 6,717,814 | B2 | 4/2004 | Li |
| 6,973,962 | B2* | 12/2005 | Hwang et al. ............. 165/80.3 |
| 7,000,687 | B2* | 2/2006 | Ying et al. ............. 165/104.33 |
| 7,206,207 | B2* | 4/2007 | He ............................. 361/825 |
| 7,215,548 | B1* | 5/2007 | Wu et al. .................... 361/703 |
| 2006/0120046 | A1* | 6/2006 | Yu et al. ..................... 361/697 |
| 2006/0254750 | A1* | 11/2006 | Miyazawa et al. ......... 165/80.3 |
| 2007/0091568 | A1* | 4/2007 | Chen et al. ................. 361/696 |

* cited by examiner

*Primary Examiner*—Michael Datskovskiy
(74) *Attorney, Agent, or Firm*—Jeffrey T. Knapp

(57) ABSTRACT

A heat dissipation device includes a heat sink including a heat conducting portion and a plurality of fins extending from the heat conducting portion. The heat conducting portion has a base portion for contacting a heat generating device, and two wing portions extending from the base portion. The heat sink has two slits extending through two opposite sides thereof. A fan holder having a fan mounted thereon is attached to a face of the heat sink. The fan holder includes two brackets each having a rib engaged in a corresponding slit of the heat sink to thereby attach the fan holder to the heat sink, and a faceplate having the fan thereon. The faceplate has an ear secured to a corresponding wing portion of the heat sink by a screw and a tab extending upwardly beyond a top end of the heat sink.

16 Claims, 3 Drawing Sheets

HEAT DISSIPATION DEVICE HAVING A FAN HOLDER FOR ATTACHMENT OF A FAN

FIELD OF THE INVENTION

The present invention relates generally to a heat dissipation device, and more particularly to a heat dissipation device incorporating with a fan for dissipating heat generated by an electronic device. The heat dissipation device has a fan holder for attachment of the fan.

DESCRIPTION OF RELATED ART

It is well known that during operation of a computer electronic devices such as central processing units (CPUs) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is desired to provided forced airflow to the heat sink. Usually, the fan is mounted to the heat sink by a fan holder attached to the heat sink. Conventionally, the heat sink mainly comprises a heat conducting base contacting a heat generating electronic device and a plurality of heat dissipating fins extending from one face of the base. A plurality of screw threads is formed in two outermost fins at each side of the heat sink. The fan holder defines a plurality of fixing apertures corresponding to the screw threads of the heat sink. Pluralities of screws are engaged in the fixing apertures of the fan holder and the screw threads of the heat sink, thereby fastening the fan holder to the heat sink. The fan is mounted on the fan holder using a number of screws. The structure can mount the fan to the heat sink, but a problem is that complexities arise when installing the fan holder to the heat sink using multiple screws.

What is needed, therefore, is a heat dissipation device incorporating a fan holder easily mounted to a heat sink thereof.

SUMMARY OF INVENTION

A heat dissipation device in accordance with a preferred embodiment of the present invention comprises a heat sink including a heat conducting portion and a plurality of fins extending from the heat conducting portion. The heat conducting portion has a base portion for contacting a heat generating device, and two wing portions extending from the base portion. The heat sink has two slits extending through two opposite sides thereof. A fan holder having a fan mounted thereon is attached to a face of the heat sink. The fan holder comprises two brackets each having a rib engaged in a corresponding slit of the heat sink to thereby attach the fan holder to the heat sink, and a faceplate having the fan thereon. The faceplate has an ear screwed to a corresponding wing portion of the heat sink and a tab extending upwardly beyond a top end of the heat sink.

Other advantages and novel features will become more apparent from the following detailed description of preferred embodiments when taken in conjunction with the accompanying drawings, in which:

BRIEF DESCRIPTION OF DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION

Reference will now be made to the drawings to describe the present invention in detail.

Figure 1:
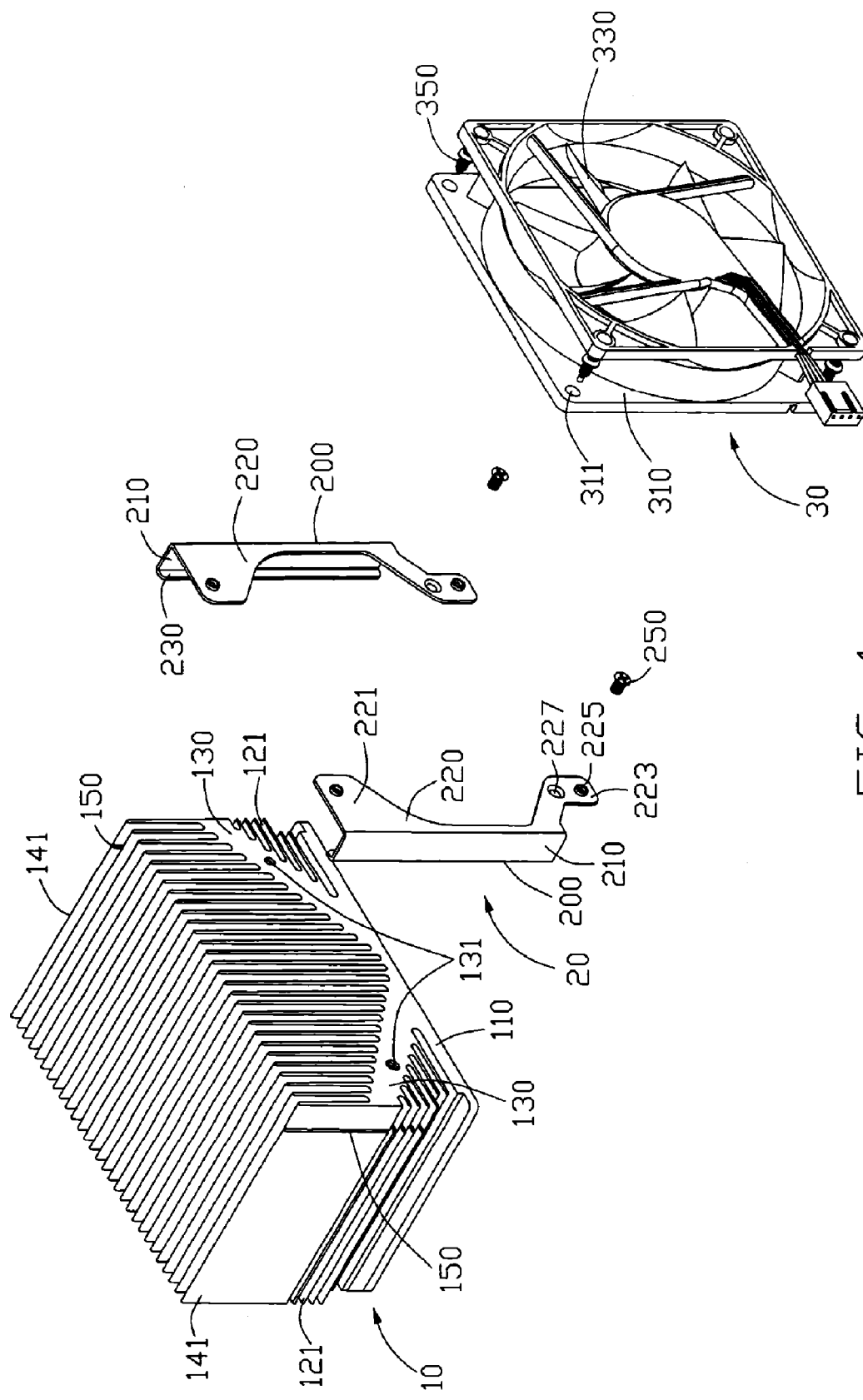
FIG. 1 is an exploded, isometric view of a heat dissipation device in accordance with a preferred embodiment of the present invention.

FIGS. 1 illustrates a heat dissipation device in accordance with a preferred embodiment of the present invention. The heat dissipation device comprises a heat sink 10, a fan holder 20 located aside the heat sink 10, and a fan 30 mounted on the fan holder.

The heat sink 10 is integrally extruded from metal, and comprises a heat conducting portion and a plurality of fins extending from the heat conducting portion. The heat conducting portion comprises a base portion 110 having a bottom face for contacting a heat-generating electronic device such as a CPU, and two wing portions 130 extending upwardly and outwardly from a central portion of the base portion 110 to two opposite lateral side portions of the heat sink 10. The two wing portions 130 divide the fins into three fin units: two first fin units located between the wing portions 130 and the base portion 110 and a second fins unit located between the two wing portions 130. The two first fin units comprise a plurality of parallel first fins 121 horizontally extending outwardly from the wing portions 130 and parallel to the base portion 110. The second fins unit comprises a plurality of parallel second fins 141 longitudinally extending upwardly from the two wing portions 130. The second fins 141 are perpendicular to the first fins 121 of the first fin units. At a front face of the heat sink 10, two threaded holes 131 are defined in the two wing portions 130 at a level. Two slits 150 are defined in two opposite lateral sides and located adjacent to the front face of the heat sink 10. Each slit 150 is defined in an outmost second fin 141 and outmost ends of a plurality of first fins 121 of a corresponding first fins unit.

The fan holder 20 comprises two brackets 200 attached to the two lateral sides of the front face of the heat sink 10. Each bracket 200 comprises a main body 210. A substantially C-shaped fixing faceplate 220 and a positioning rib 230 perpendicularly extend from opposing lateral edges of the main body 210, respectively. The faceplate 220 comprises a tab 221 and an ear 223 at upper and lower parts thereof, respectively. An indentation (not labeled) is defined between the tab 221 and the ear 223. A thread aperture 225 is defined in each of the tab 221 and the ear 223. Above the thread aperture 225 in the ear 223, a through hole 227 is defined therein.

Figure 2:
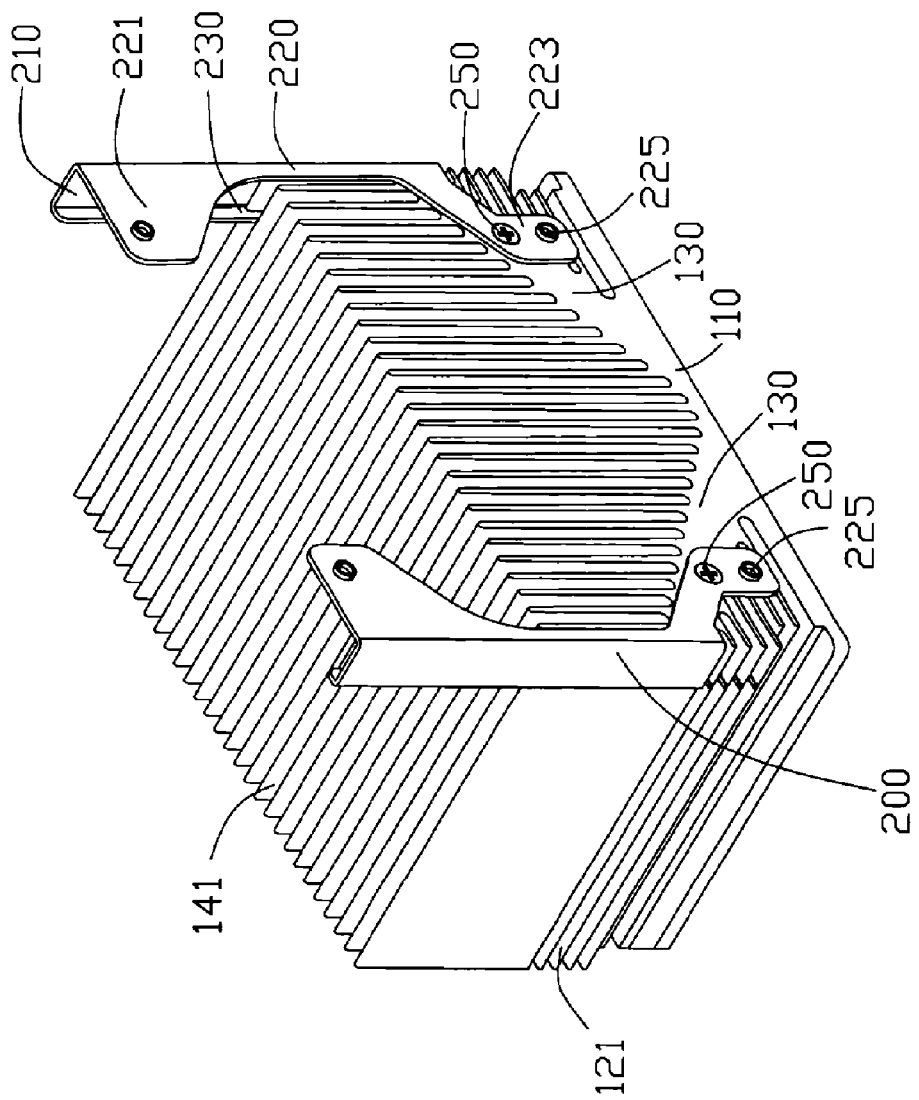
FIG. 2 is an assembled view of a fan holder and a heat sink shown in FIG. 1.

Referring to FIG. 2, in assembly the fan holder 20 to the heat sink 10. The ribs 230 of the brackets 200 of the fan holder 20 are inserted in corresponding slits 150 of the heat sink 10. The faceplates 220 of the brackets 200 are located on the front face of the heat sink 10 and are fixed to the front face by two screws 250 passing through the through hole 227 of the ears 223 of the faceplate 220 and screwing into the threaded holes 131 of the heat sink 10. In this way the two brackets 200 are fixed to the heat sink 10 with the two faceplates 220 thereof extending toward each other. In this case, the tabs 221 extend upwardly beyond an upper end of the heat sink 10.

Figure 3:
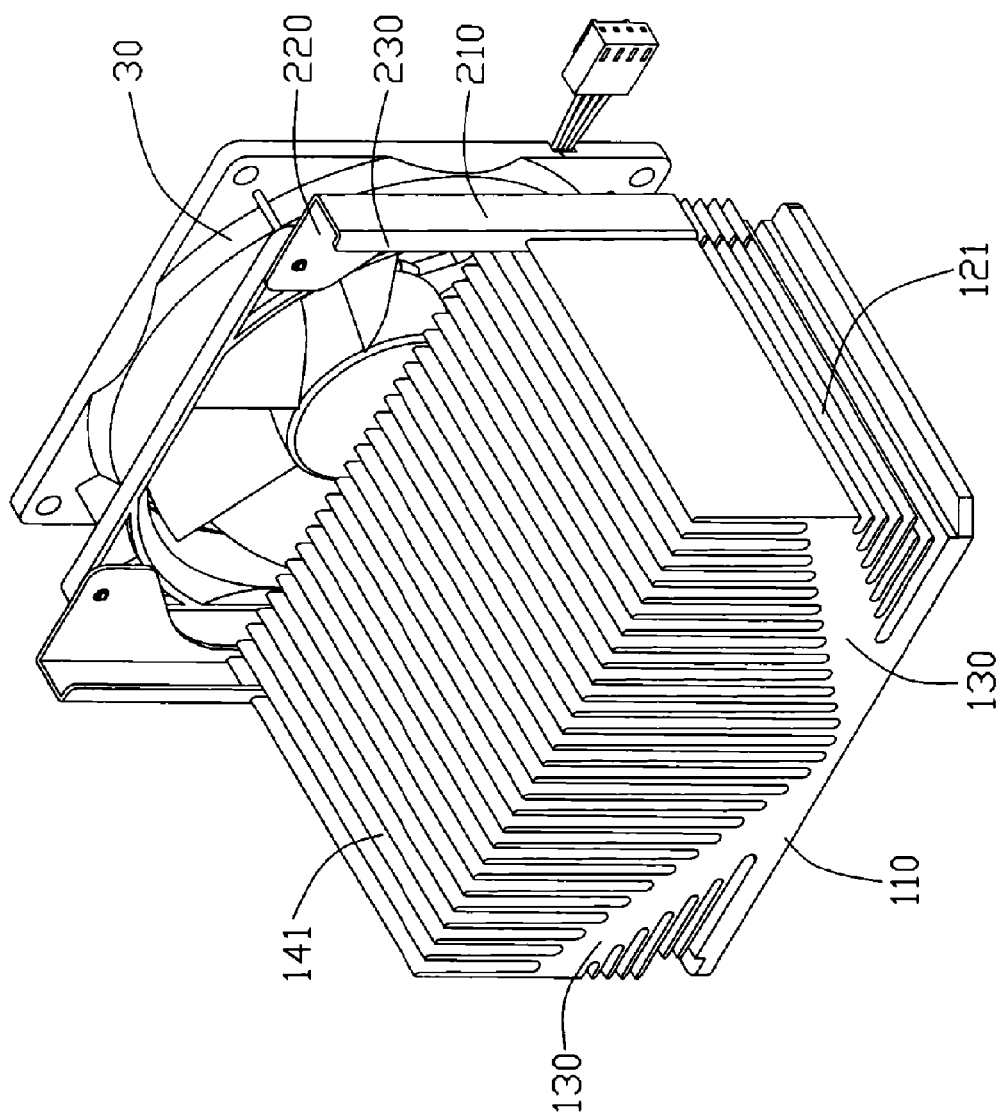
FIG. 3 is an assembled view of FIG. 1, but from a different aspect.

Referring to FIGS. 1-3, the fan 30 comprises a rectangular frame 310 and a blades unit 330 located in the frame 310. The frame 310 defines four orifices 311 in four corners corresponding to the thread apertures 225 of the faceplates 220 of the brackets 200 of the fan holder 20. Four screws 350 are engaged in the orifices 311 of the frame 310 and screwed in the thread apertures 225 of the faceplates 220 to thereby fasten the fan 30 to the front face of the heat sink 10 with the an upper portion of the fan 30 extending upwardly beyond the upper end of the heat sink 10.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A heat dissipation device comprising:
    a heat sink comprising a heat conducting portion and a plurality of fins extending from the heat conducting portion, the heat conducting portion having a base portion for contacting a heat generating device, and two wing portions extending from the base portion, two slits being defined in two opposite sides of heat sink;
    a fan being located aside the heat sink; and
    a fan holder having two brackets each comprising a faceplate attached to a face of the heat sink and fixing the fan thereon, and a rib substantially parallel to the faceplate and fittingly engaged in a corresponding slit of the heat sink;
    wherein the base portion and the wing portions of the heat sink divide the fins into three portions: two first fin units and a second fin unit; and
    wherein the faceplate of each bracket of the fan holder comprises a tab and an ear at two ends thereof, respectively an indentation being defined between the tab and the ear.

2. The heat dissipation device of claim 1, wherein the fins of the two first fin units extend from the two wing portions along directions opposite to each other.

3. The heat dissipation device of claim 2, wherein the fins of the second fin unit are substantially perpendicular to the base portion of the heat sink.

4. The heat dissipation device of claim 1, wherein the fins of the first fin units are parallel to the base portion and extend outwardly from the two wing portions of the heat sink.

5. The heat dissipation device of claim 4, wherein each of the first fin units is located between a corresponding one of the wing portions and the base portion.

6. The heat dissipation device of claim 5, wherein the slits of the heat sink each extend through an outermost fin of the second fin unit and outmost ends of the fins of the first fin units.

7. The heat dissipation device of claim 1, wherein the faceplate of each bracket of the fan holder is substantially C-shaped.

8. The heat dissipation device of claim 1, wherein each of the two wing portions of the heat sink defines a threaded hole, the ears of the brackets of the fan holder define two through holes, two screws being engaged in the through holes and the threaded holes to thereby attach the brackets to the heat sink.

9. The heat dissipation device of claim 1, wherein the tab and the ear of the faceplate of each bracket of the fan holder define two thread apertures therein, a plurality of screws being engaged in a plurality of through orifices defined in the fan and the thread apertures of the brackets to thereby fasten the fan to the fan holder.

10. The heat dissipation device of claim 9, wherein each bracket of the fan holder comprises a main body connecting the rib and the faceplate, the main body and the faceplate being located on their respective adjacent faces of the heat sink.

11. A heat dissipation device comprising:
    a heat sink comprising a plurality of heat conducting portions and a plurality of fin units extending from the heat conducting portions, two slits being defined in the heat sink;
    a fan holder comprising two ribs engaged in their respective slits of the heat sink thereby attaching the fan holder to the heat sink, and a faceplate having a fan attached thereon, the faceplate having an ear engaging with a corresponding heat conducting portion and a tab extending beyond the heat sink.

12. The heat dissipation device of claim 11, wherein the heat sink is integrally made from a one-piece metal block, the heat conducting portions comprises a base portion for contacting a heat generating device and two wing portions integrally extending from the base portion.

13. The heat dissipation device of claim 12, wherein the fin units of the heat sink comprises two first fin units each extending outwardly from their respective wing portions, said first fin units being located between a corresponding wing portion and the base portion, and a second fin unit which is perpendicular to the first fin units extending perpendicularly from the two wing portions.

14. The heat dissipation device of claim 12, wherein the wing portions of the heat sink define two threaded holes therein, the faceplate of the fan holder being fixed to the heat sink via two screws extending through the ear of the faceplate and being engaged in the threaded holes of the wing portions.

15. A heat dissipation device for a heat-generating electronic device comprising:
    a heat sink having vertically extending fins and horizontally extending fins, a slit defined in an outmost side of the heat sink and trough at least one of the vertically extending fins and at least one of the horizontally extending fins;
    a fan mounting bracket having a body, a rib and a faceplate extending from two sides of the body respectively, wherein the rib is fitted into the slit and the faceplate abutting against a front face of the heat sink;
    a screw extending through the faceplate and screwed into the heat sink to securely attach the bracket to the heat sink; and
    a fan fastened to the bracket;
    wherein the heat sink has a base adapted for thermally engaging with the heat-generating electronic device and a wing extending upwardly and outwardly from the base, the horizontally extending fins are formed between the wing and the base and the vertically extending fins are formed on the wing; and
    wherein the screw is screwed to the wing of the heat sink.

16. The heat dissipation device of claim 15, wherein the fan is fastened to the bracket by extending two screws through the fan and screwed in the bracket, the screw screwing the bracket to the heat sink being located between the screws fastening the fan to the bracket.

* * * * *